US00RE39774E

(19) United States
(12) Reissued Patent
Chang

(10) Patent Number: US RE39,774 E
(45) Date of Reissued Patent: Aug. 14, 2007

(54) FAN GUARD STRUCTURE FOR ADDITIONAL SUPERCHARGING FUNCTION

(75) Inventor: Shun-Chen Chang, Taipei (TW)

(73) Assignee: Delta Electronics, Inc., Taoyuan Hsien (TW)

(21) Appl. No.: 10/387,234

(22) Filed: Mar. 12, 2003

Related U.S. Patent Documents

Reissue of:
(64) Patent No.: 6,244,818
Issued: Jun. 12, 2001
Appl. No.: 09/375,862
Filed: Aug. 17, 1999

(30) Foreign Application Priority Data

Mar. 2, 1999 (TW) ..... 88203171

(51) Int. Cl.
*F01D 9/00* (2006.01)
*F04D 29/44* (2006.01)

(52) U.S. Cl. ..... 415/208.2; 415/209.1; 415/193; 415/199.4; 415/223; 416/247 R

(58) Field of Classification Search ..... 415/208.2, 415/209.1, 211.2, 220, 121.2, 185, 191, 193, 415/192, 199.4, 199.5, 214.1, 223, 66, 68, 415/198.1; 416/247 R, 196 R, 194, 196 A
See application file for complete search history.

(56) References Cited

U.S. PATENT DOCUMENTS 1,062,258 A 5/1913 Schlotter
1,747,627 A * 2/1930 Guth ..... 416/196 R
2,154,313 A 4/1939 McMahan (Continued)

FOREIGN PATENT DOCUMENTS

GB 2 156 007 10/1985
JP 33-18660 6/1931
JP 57-186097 11/1982

(Continued)

OTHER PUBLICATIONS

Merium–Webster Online Dictionary.*
Encyclopedia Britannica Online. http://www.britannica.com/eb/article?tocId=9005219. Accessed May 25, 2005.*
Merriam–Webster's Collegiate Dictionary, Tenth Edition, 1998, p. 25.*
"Design of Ventilator and Pump," 1971, Taiwan, with concise statement of relevance in English.
"Ventilator Handbook," 1994, China, with concise statement of relevance in English.
"Fluid Mechanics," 1993, Taiwan, with concise statement of relevance in English.
"Design of Ventilator and Pump," 1971, Taiwan.
"Fan Handbook Selection, Application, and Design," Frank P. Bleier, 1997.
"Axial Flow Fans and Ducts," 1997.
"Ventilator Handbook," 1994, China.
Fluid Mechanics, 1993, Taiwan.
"Aircraft Gas Turbine Engine Technology," Chapter 5, 1994.

*Primary Examiner*—Richard A Edgar
(74) *Attorney, Agent, or Firm*—Greer, Burns & Crain, Ltd.

(57) ABSTRACT

A fan guard has a function of supercharging a fan in addition to supporting a rotor device is disclosed. The fan guard is to be mounted beside the rotor device for supporting the rotor device, and additionally, the fan guard interacts with an airflow generated by the revolution of the rotor blades to supercharge the fan. The fan guard essentially includes a main frame, and a set of guard blades radially arranged inside the main frame and fixed onto an inner surface of the main frame by each one end thereof. Each of the guard blades is preferred to have a shape similar to the shape of the rotor blades, and the set of guard blades can be arranged either upstream or downstream of the rotor blades.

42 Claims, 11 Drawing Sheets

U.S. PATENT DOCUMENTS

| | | | | | |
|---|---|---|---|---|---|
| 2,208,615 | A | * | 7/1940 | Wattendorf | 415/220 |
| 2,592,471 | A | * | 4/1952 | Sawyer | 415/220 |
| 2,952,403 | A | * | 9/1960 | Stalker | 415/220 |
| 3,168,235 | A | | 2/1965 | Valdi | |
| 3,342,254 | A | | 9/1967 | Fujie | |
| 3,883,264 | A | | 5/1975 | Rao | |
| 3,924,964 | A | | 12/1975 | Lievens et al. | |
| 3,995,970 | A | * | 12/1976 | Nobuyuki | |
| 4,483,624 | A | * | 11/1984 | Bacon et al. | 366/293 |
| 4,603,271 | A | * | 7/1986 | Maruyama et al. | 416/170 R |
| 4,724,747 | A | | 2/1988 | Sturm et al. | |
| 4,968,216 | A | | 11/1990 | Anderson et al. | |
| 4,971,143 | A | | 11/1990 | Hogan | |
| 5,295,811 | A | * | 3/1994 | Chiu | 415/208.2 |
| 5,342,167 | A | * | 8/1994 | Rosseau | 415/220 |
| 5,393,197 | A | | 2/1995 | Lemont et al. | |
| 5,546,272 | A | * | 8/1996 | Moss et al. | 415/66 |
| 5,839,205 | A | | 11/1998 | Hung | |
| 6,024,536 | A | | 2/2000 | Tsubakida et al. | |
| 6,092,988 | A | * | 7/2000 | Botros | 415/191 |
| 6,142,733 | A | * | 11/2000 | Alizadeh et al. | 415/208.2 |
| 6,547,540 | B1 | * | 4/2003 | Horng et al. | 415/208.2 |
| 6,663,342 | B2 | * | 12/2003 | Huang et al. | 415/208.2 |

FOREIGN PATENT DOCUMENTS

| | | |
|---|---|---|
| JP | 57-186098 | 11/1982 |
| JP | 61-41886 | 3/1986 |
| JP | 61-104116 | 7/1986 |
| JP | 2-26799 | 2/1990 |
| JP | 55-24399 | 6/1990 |
| JP | 2-103198 | 8/1990 |
| JP | 2823657 | 1/1991 |
| JP | 03-23700 | 3/1991 |
| JP | 03-206398 | 9/1991 |
| JP | 10-066305 | 3/1998 |
| JP | 10-205497 | 8/1998 |

* cited by examiner

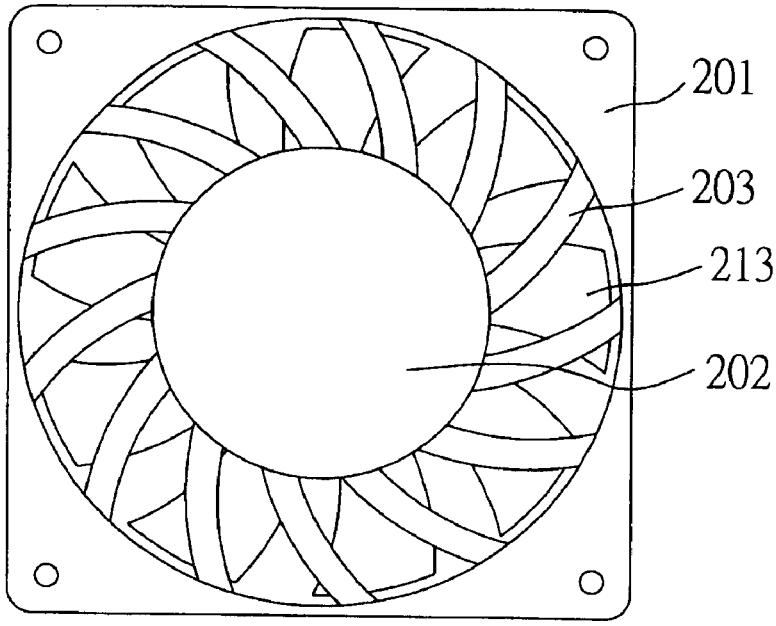
Fig. 2C (New)
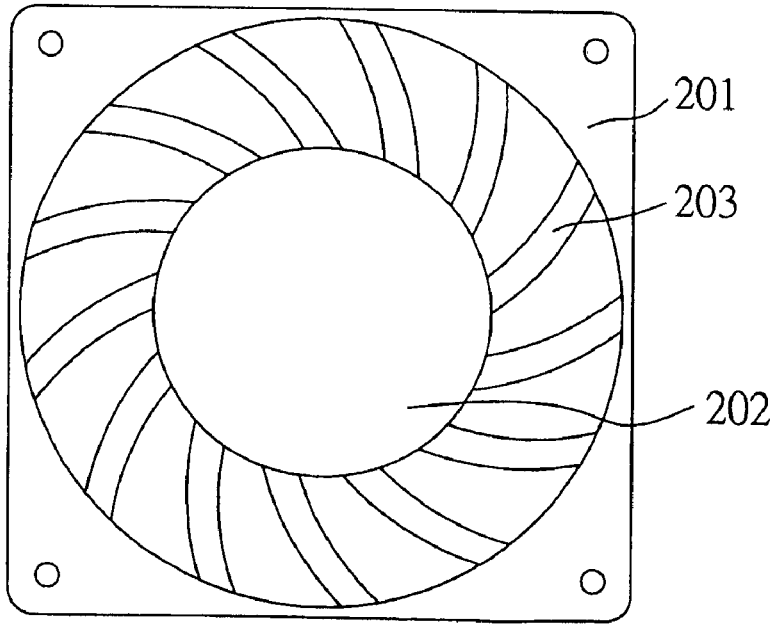
Fig. 2D (New)

FAN GUARD STRUCTURE FOR ADDITIONAL SUPERCHARGING FUNCTION

Matter enclosed in heavy brackets [ ] appears in the original patent but forms no part of this reissue specification; matter printed in italics indicates the additions made by reissue.

FIELD OF THE INVENTION

The present invention is related to a fan guard structure, and more particular to an improved fan guard structure which imparts a supercharging function to a fan for efficient heat dissipation.

BACKGROUND OF THE INVENTION

Currently, heat-dissipating fans commonly used in personal computers include an axial-flow fan, a centrifugal fan and a cross-flow fan. Of these, the most popular one is supposed to be an axial-flow fan.

A fan is primarily consisted of a rotor device and a fan guard arranged beside the rotor device for supporting the rotor device. Referring to FIG. 1, the fan guard 10 of a conventional axial-flow fan is constructed by a main frame 101, a motor holder 102 and a plurality of ribs 103 arranged between the main frame 101 and the motor holder 102. The rotor device 11 includes a motor (not shown) received in the motor holder 102, a shaft ring 111 connected to and driven by the motor to revolve, and a plurality of rotor blades 112 fixed on the circumferential surface of the shaft ring 111 and revolving with the shaft ring 111 to work on the surrounding air to generate an airflow. Through the work of the rotor blades on the surrounding air, the blast pressure is changed from a relatively low value on the air inlet side into a relatively high value on the air outlet side. That is, there is a blast pressure enhancement on the air outlet side.

Unfortunately, when the airflow further flows through the fan guard having the structure as shown in FIG. 1 and as described above, turbulent flows will be generated after the airflow encounters the ribs so as to have an adverse effect on the blast pressure enhancement. Consequently, the efficiency of the fan is reduced.

SUMMARY OF THE INVENTION

Therefore, an object of the present invention is to provide an improved fan guard structure which has a function of supercharging a fan in addition to supporting a rotor device.

The present invention is related to a fan guard to be mounted beside a rotor device of a fan for supporting the rotor device. Additionally, the fan guard according to the present invention interacts with an airflow generated by the revolution of the rotor blades to supercharge the fan.

The fan guard essentially includes a main frame, and a set of guard blades radially arranged inside the main frame and fixed onto an inner surface of the main frame by each one end thereof. Generally but not definitely, a count of the guard blades is about 1–2 times of that of the rotor blades. Preferably, the other ends of the guard blades are fixed onto a cylindrical motor holder which is located at the center of the main frame, and is hollow for receiving therein a motor used for driving the rotor blades to revolve. Especially preferred, at least one reinforcing ring connecting all of the guard blades is provided for strengthening the far guard. In general, the guard blades are made of plastic. Nevertheless, the guard blades can also be made of a material other than plastic for a desired purpose. For example, they can be made of a metal which is advantageous for heat dissipation.

To assemble the fan, the main frame of the fan guard is coupled to the frame of the rotor device. Alternatively, the main frame of the fan guard is integrally formed with the frame of the rotor device so that the fan can be assembled by installing the non-integrally formed parts into the common frame. The fan guard can be arranged either upstream or downstream of the rotor device. Preferably, the fan guard includes two sets of frame and guard blades respectively arranged by both sides of the rotor device. By properly designing the shapes and the position arrangement of the guard blades relative to the rotor blades, the upstream guard blades can guide air into the rotor device at an angle to make an air inflow to the rotor device have an additional tangential velocity which increases the work of the rotor blades on air, and on the other hand, the downstream guard blades can transform a tangential velocity of an air outflow from the rotor device into a static pressure, both advantageous for supercharging the fan. For example, all of the guard blades are made to have a shape identical to the shape of the rotor blades. As for the position arrangement of the downstream guard blades relative to the upstream rotor blades, one of the guard blades and one of the rotor blades constitute a near letter C configuration in a cross-sectional view instantaneously. Contrarily, the position arrangement of the upstream guard blades relative to the downstream rotor blades makes one of the guard blades and one of the rotor blades constitute a near letter S configuration in a cross-sectional view instantaneously.

Furthermore, by taking the combination of a fan guard according to the present invention and a rotor device as a fan unit, a fan can be designed to include a plurality of such fan units to enhance efficiency.

BRIEF DESCRIPTION OF THE DRAWING

The present invention may best be understood through the following description with reference to the accompanying drawings, in which:

*FIG. 2C is a bottom view of the fan shown in FIG. 2B;*

*FIG. 2D is a bottom view of the fan guard shown in FIG. 2A;*

DETAILED DESCRIPTION OF THE PREFERRED EMBODIMENT

Figure 1:
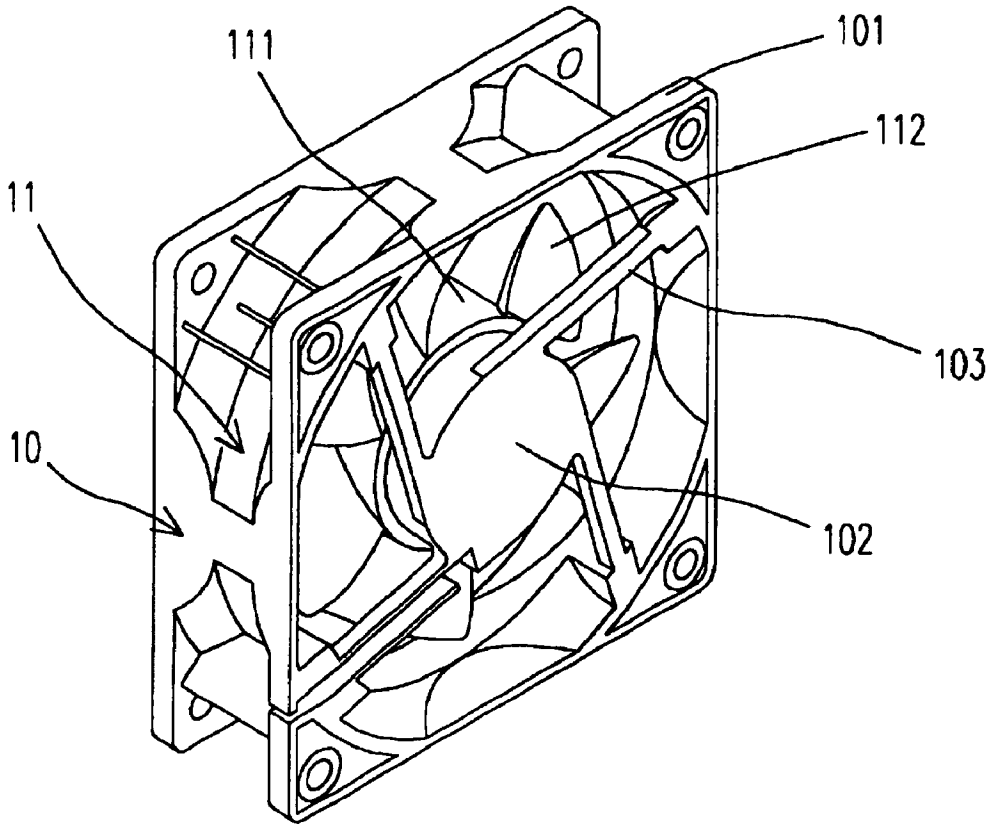
Fig. 1(PRIOR ART)
FIG. 1 is a schematic diagram showing a conventional axial flow fan.

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed. On the other hand, all arrows shown in the drawings are used for schematically illustrating the directions of airflows and velocities, and the length of the arrows does not indicate the measure of the corresponding items.

Figure 2A:
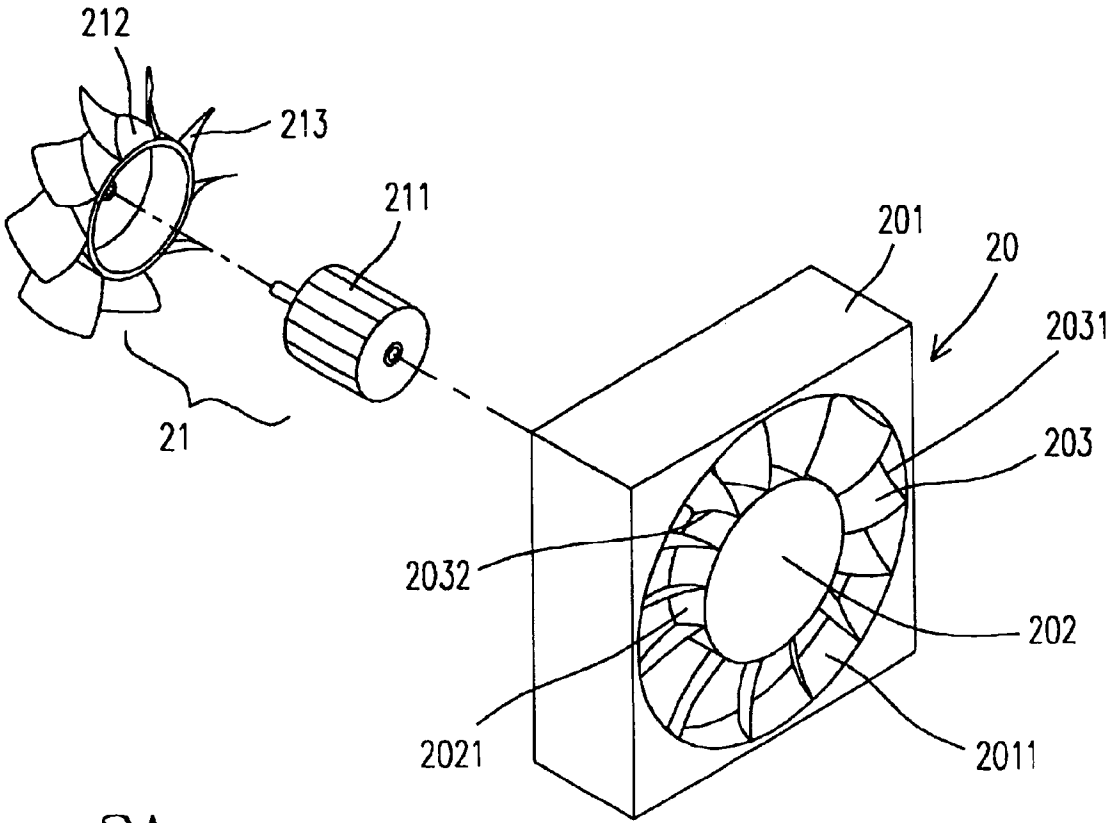
FIG. 2A is a resolving diagram of a first preferred embodiment of a fan according to the present invention.

Please refer to [FIG. 2A] *FIGS. 2A and 2D* which schematically shows a rotor device and a preferred embodiment of a fan guard according to the present invention. The rotor device 21, as conventionally used, includes a motor 211, a shaft ring 212 connected to the motor 211, and a plurality of rotor blades 213 fixed on the circumferential surface of the shaft ring 212. The fan guard 20 includes a main frame 201, a motor holder 202, and a plurality of guard blades 203. The motor holder 202 is a hollow cylinder located at the center inside the frame for receiving therein the motor 211. The guard blades 203 are radially disposed within the main frame 201. One end 2031 of each of the guard blades 203 is fixed onto the inner surface 2011 of the main frame 201 and the other end 2032 thereof is fixed onto the circumferential surface 2021 of the motor holder 202. In this embodiment, the frames of the fan guard and the rotor device are integrally formed as the main frame 201. In other words, the motor 211, shaft ring 212, rotor blades 213, motor holder 202, and guard blades 203 are all positioned inside the main frame 201.

Figure 2B:
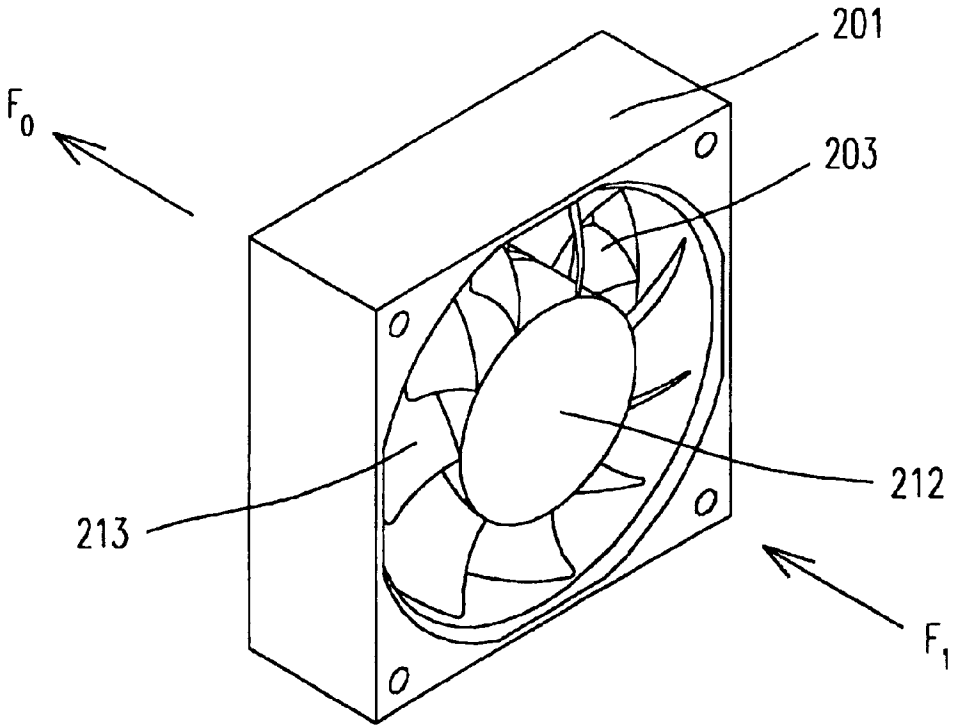
FIG. 2B is a perspective diagram of the assembled fan of FIG. 2A with the rotor device facing forwards.

The assembled fan is shown on [FIG. 2B] *FIGS. 2B and 2C*. In this embodiment, the rotor blades are located upstream of the guard blades. When the fan operates, the motor 211 (see FIG. 2A) drives the shaft ring 212 with the rotor blades 213 to revolve. The revolution of the rotor blades 213 results in work on the surrounding air to generate an airflow. The arrows Fi and Fo in the figure indicates the air inflow and the air outflow, respectively. Through the work of the rotor blades on the surrounding air, the blast pressure is changed from a relatively low value on the air inlet (Fi) side into a relatively high value on the air outlet (Fm, FIG. 3) side. That is, there is a blast pressure enhancement on the air outlet (Fm) side. According to the present invention, the blast pressure can be further increased on the air outflow (Fo) side through the guard blades of the fan guard for the reason described as follows.

Figure 3:
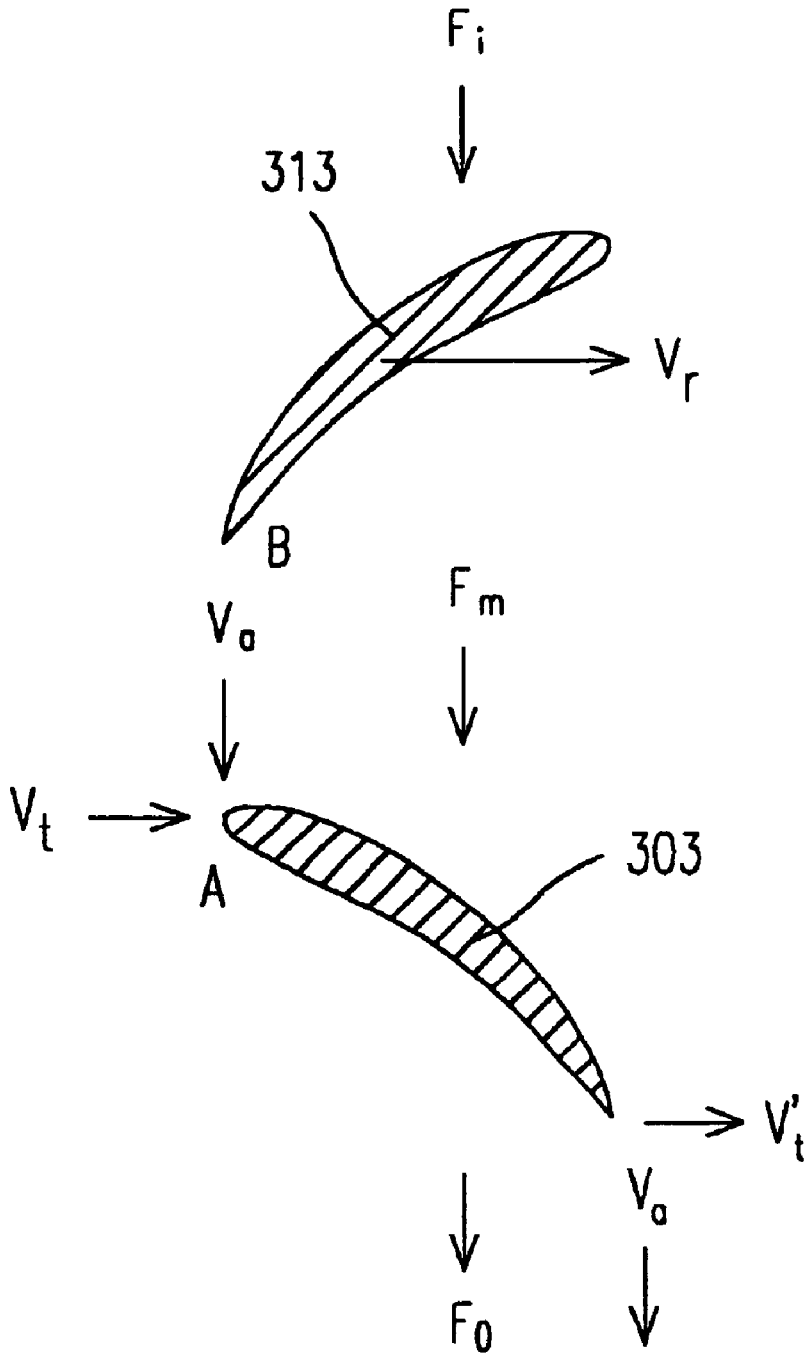
FIG. 3 is a cross-sectional view of a rotor blade and a guard blade of the fan of FIG. 2.

Please refer to FIG. 3. In order to concretely illustrate the arrangement of the guard blades, an upstream rotor blade 313 which can be any one of the rotor blades and a downstream guard blade 303 which can be any one of the guard blades, are shown in a cross-sectional view, and a specific moment that a leading point A of the guard blade 303 is moved to be axially aligned with the trailing point B of the rotor blade 313 is taken to facilitate to describe the position relationship between the selected rotor blade and guard blade. As shown, the rotor and the guard blades 313 and 303 constitute a near letter C configuration.

When the rotor device operates to have the rotor blade 313 revolve at a tangential velocity Vr, the airflow arriving at the guard blade 303 has an axial velocity and a tangential velocity. Due to conservation of mass, the axial velocity will not change through the entire guard blade 303, and is represented by a reference symbol Va in FIG. 3. The tangential velocity, however, varies from a relatively high value Vt approximating the velocity Vr of the rotor blade to a relatively low value Vt' down to zero. According to the Bernoulli's Law, the pressure will increase with the decrease of velocity. The tangential velocity of the airflow Fm will be transformed into a static pressure. Accordingly, the blast pressure further rises through the fan guard, and the fan is thus supercharged.

Although such a near C configuration is exemplified as above to describe a preferred embodiment, other configurations are acceptable as long as the purpose of transforming a tangential velocity into a static pressure can be achieved.

Figure 4:
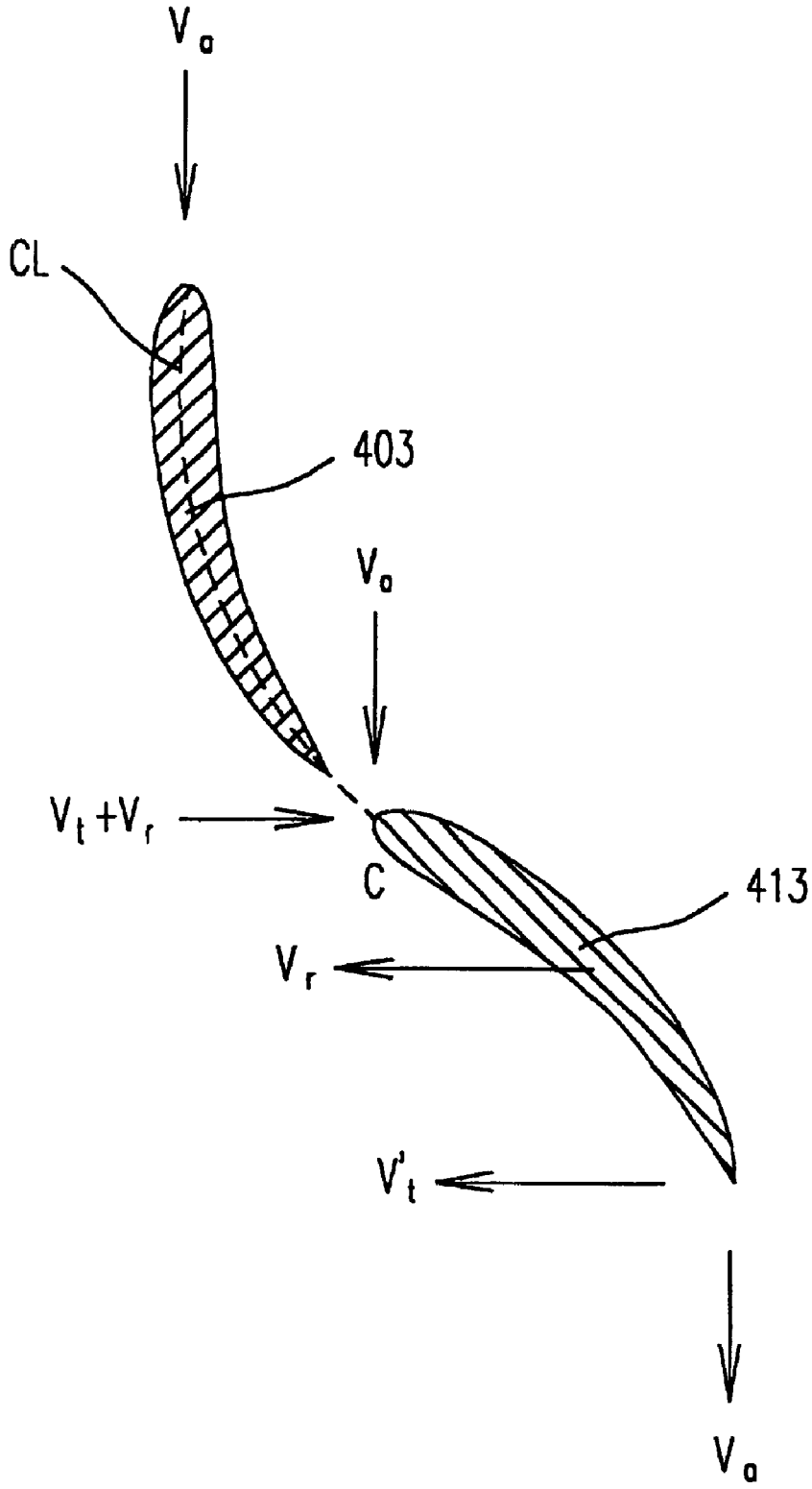
FIG. 4 is a cross-sectional view of a rotor blade and a guard blade of a second preferred embodiment of a fan according to the present invention.

In another embodiment according to the present invention, the guard blades are arranged upstream of the rotor blades. As shown in FIG. 4, the position relationship between an upstream guard blade 403 and a downstream rotor blade 413 is illustrated at a moment that a leading point C of the rotor blade 403 is moved to follow the camber line CL of the guard blade 403. The guard and rotor blades 403 and 413 at such moment constitute a near letter S configuration.

When the rotor device operates to have the rotor blade 413 revolve at a tangential velocity Vr, the guard blade 403 guide air into the rotor blade 413 at an angle. Consequently, the air outflow from the guard blade 403 has an axial velocity Va and a tangential velocity Vt, and thus the airflow arriving at the rotor blade 413 has a tangential velocity of Vr+Vt. As known, the increase of the tangential velocity enhances the work of the rotor blades on air, so in this way, the fan is supercharged.

Although such a near S configuration is exemplified as above to describe a preferred embodiment, other configurations are acceptable as long as the purpose of providing an additional tangential velocity can be achieved.

Please now refer to FIGS. 5–8 which schematically show several composite fans which include a plurality of fan guards according to the present invention and/or rotor devices to further enhance fan efficiency.

Figure 5A:
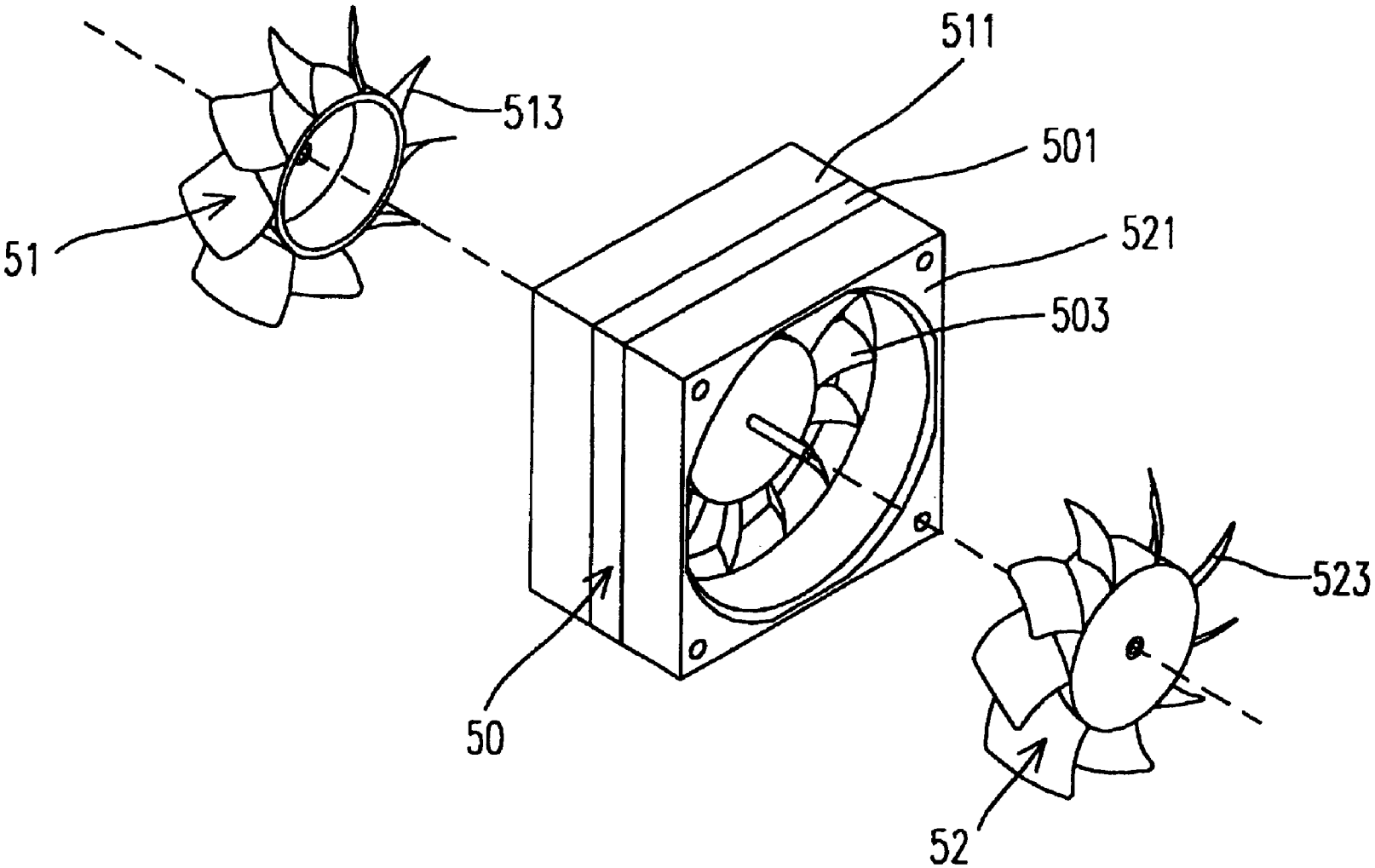
FIG. 5A is a resolving diagram of a third preferred embodiment of a fan according to the present invention.
Figure 5B:
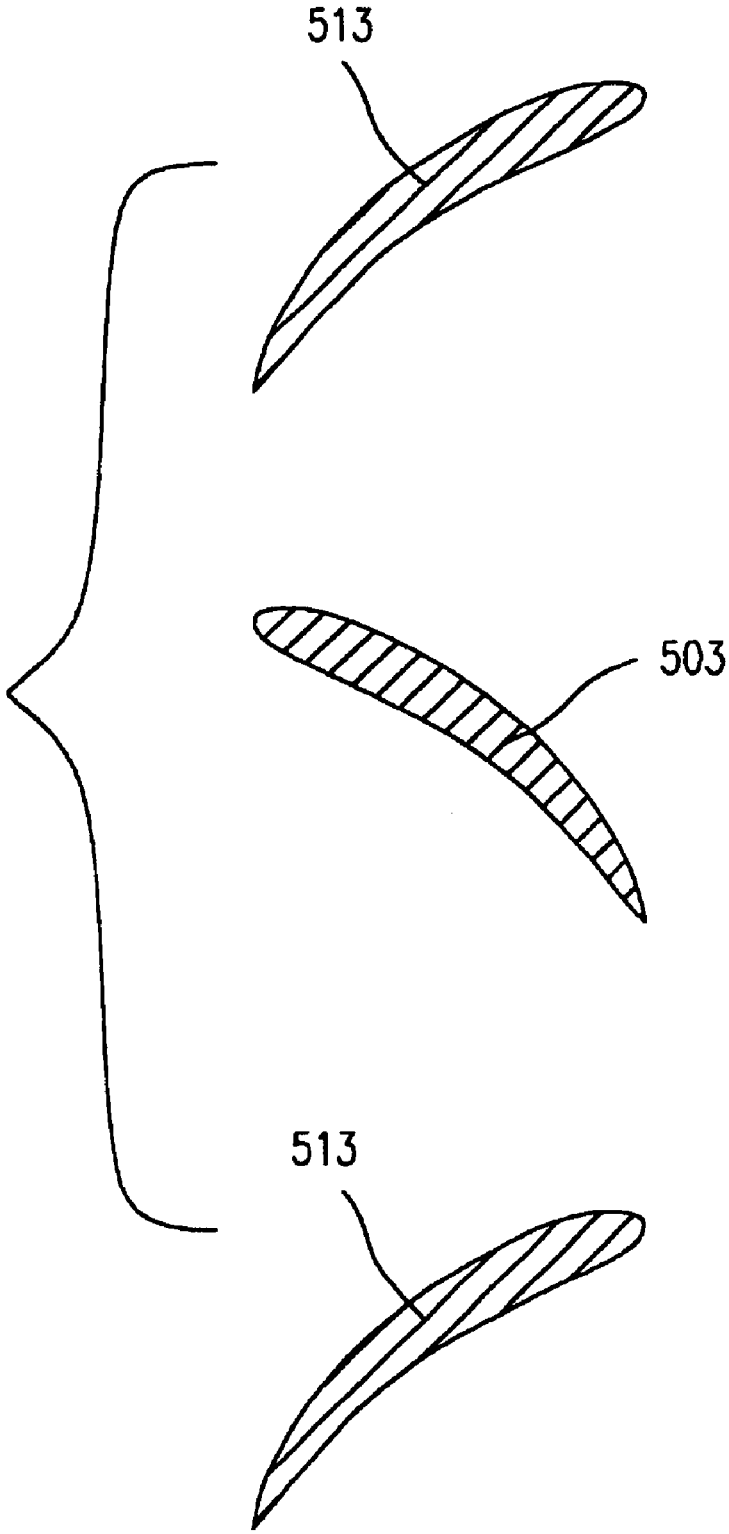
FIG. 5B is a cross-sectional view of a rotor blade and a guard blade of the fan of FIG. 5A.

The composite fan shown in FIGS. 5A and 5B is assembled by screwing the frames 511, 521 of the rotor devices 51, 52 and the frame 501 of the fan guard 50 together (FIG. 5A) so that the guard blades 503 can be upstream of the rotor blades 523 and downstream of the rotor blades 513 (FIG. 5B) to simultaneously enhance the efficiencies of the upstream rotor device 51 and downstream rotor device 523 so as to supercharge the composite fan.

Figure 6:
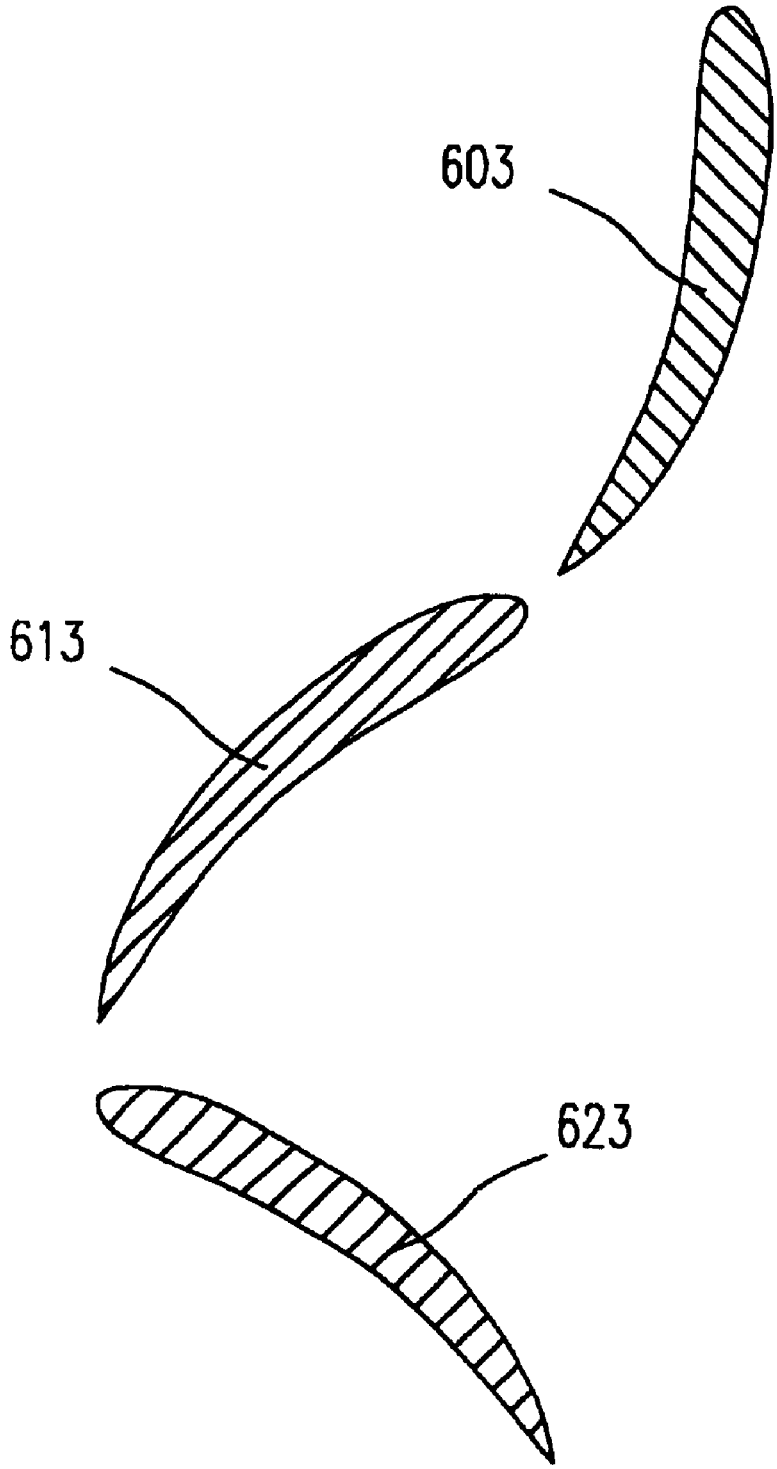
FIG. 6 is a cross-sectional view of a rotor blade and a guard blade of a fourth preferred embodiment of a fan according to the present invention.

FIG. 6 schematically shows another embodiment of composite fan according to the present invention. In this embodiment, there are a set of guard blades 603 located upstream of rotor blades 613 and another set of guard blades 623 located downstream of the rotor blades 613 to both enhance the efficiency of the rotor device. By this way, the composite fan is supercharged.

Figure 7:
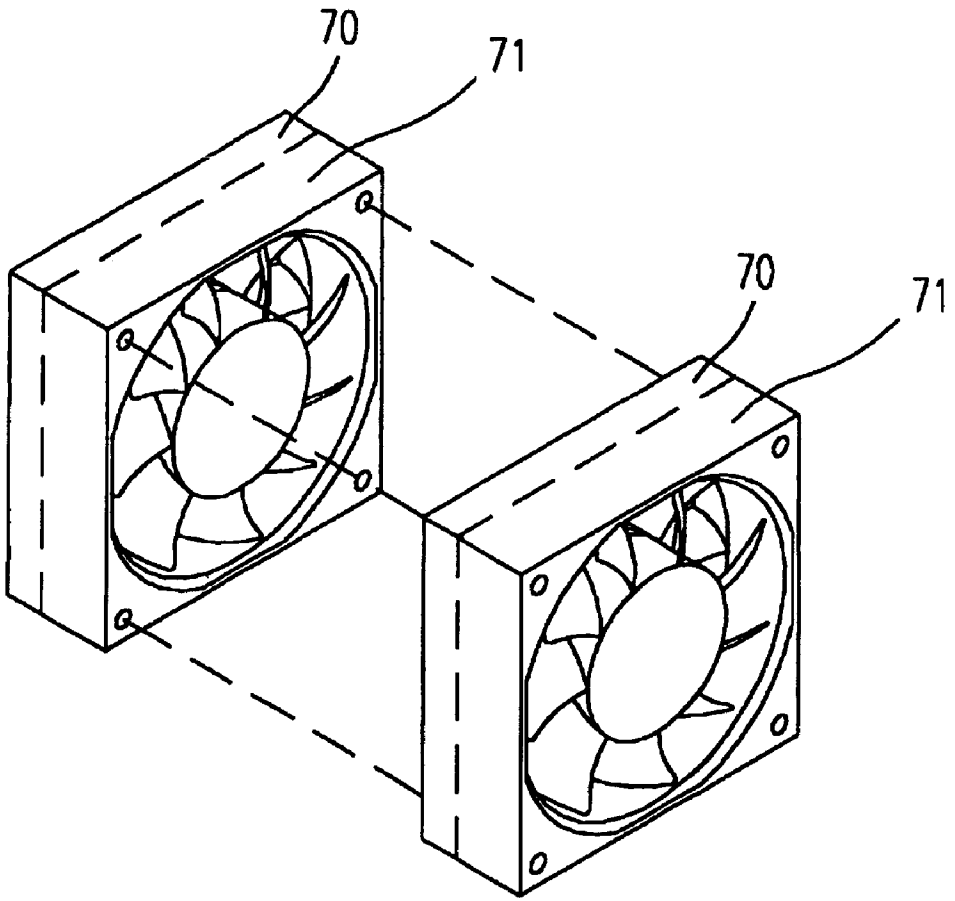
FIG. 7 is a partially resolving diagram of a fifth preferred embodiment of a fan according to the present invention.

A further embodiment of a composite fan is shown on FIG. 7 wherein two fan units, each consisting of a fan guard 70 according to the present invention and a rotor device 71, are directly coupled to form the composite fan.

Figure 8:
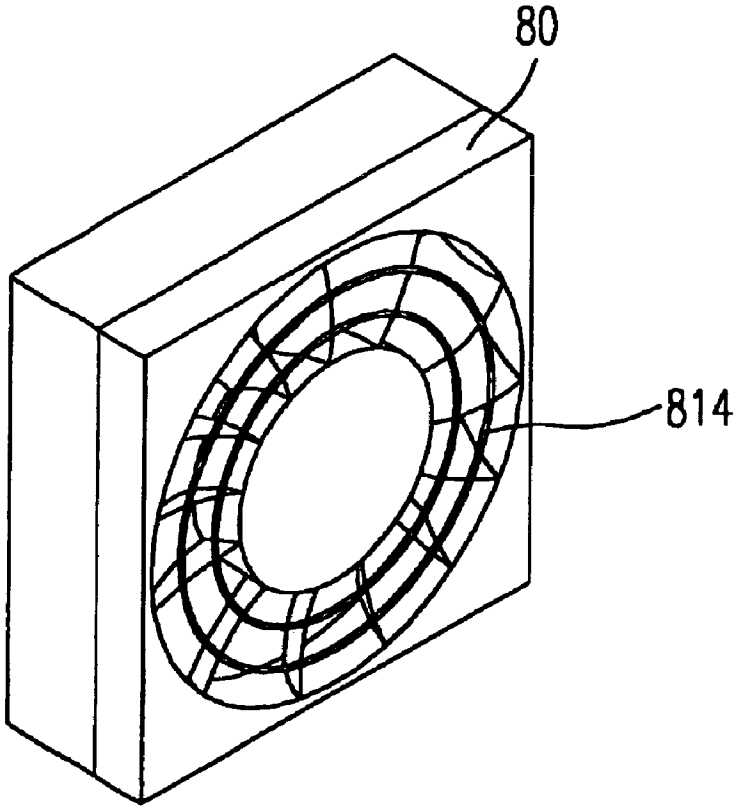
FIG. 8 is a perspective diagram of a sixth preferred embodiment of a fan according to the present invention.

On the basis of the above fan guard skeletons, at least one reinforcing ring connecting the guard blades are preferably arranged for strengthening the fan guard. Referring to FIG. 8, the fan guard 80 includes two reinforcing rings 814.

Although the guard blades in the above embodiments are exemplified to have a shape identical to the shape of the rotor blades, they can be plane plates or any other suitable shapes as long as the efficiency of the fan can be enhanced thereby.

The number of the guard blades need not be particularly limited, but one to two times of the count of the rotor blades will result in satisfactory performance.

The guard blades can be made of plastic. Nevertheless, the guard blades can also be made of a material other than plastic for a desired purpose. For example, when they are made of metal, the guard blades can serve as efficient heat-dissipating plates to further enhance the heat-dissipating efficiency.

To sum up, according to the present invention, the performance of a fan can be easily improved by changing the structure of the fan guard conventionally only used for supporting the fan. On the other hand, it is even advantageous because for the application to compact products, the high performance of the fan according to the present invention allows the fan size to be reduced so as to be installed properly.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A fan guard to be mounted beside a rotor device of a heat-dissipation fan for supporting said rotor device and supercharging said fan, comprising:

a main frame;

a first set of guard blades radially arranged inside said main frame [and], fixed onto an inner surface of said main frame by one [ends] *end* thereof, *and respectively having a radially curved profile*;

*a motor holder disposed inside said main frame for receiving and supporting a motor for driving the rotor device and enabling said motor to be received in a shaft ring of said rotor device;* and a second frame and a second set of guard blades arranged upstream of said rotor blades to guide air into said rotor device at an angle so as to make an air inflow to said rotor device have an additional tangential velocity, and thus enhance the work of said rotor blades on air;

wherein said first set of guard blades are arranged downstream of rotor blades of said rotor device, and have a shape substantially identical to that of said rotor blades, and an arrangement relative to said rotor blades allowing any one of said guard blades and any one of said rotor blades to constitute an approximate C configuration in a cross-sectional view at a moment that a leading point of said guard blade aligned with a trailing point of said rotor blade in an axial direction, and wherein curves of said downstream guard blades guide an overall air outflow from said rotor device to penetrate therethrough and be outputted in said axial direction, thereby transforming a tangential velocity of said air outflow from said rotor device into a static pressure to supercharge said fan.

2. The fan guard according to claim 1 [further comprising a] *wherein said* motor holder [which is] *comprises* a hollow cylinder substantially located at the center of said main frame, and fixed thereto the other ends of said *first set of* guard blades for receiving therein a motor used for driving said rotor blades to revolve.

3. The fan guard according to claim 1 further comprising at least one reinforcing ring connecting all of said guard blades for strengthening said fan guard.

4. The fan guard according to claim 1 wherein said guard blades are made of a material selected from a group consisting of a plastic and a metal.

*5. A fan guard for supporting a rotor device of a heat dissipation fan in order to supercharge said fan, comprising:*

*an integrally formed main frame for accommodating therein said rotor device;*

*a cylindrical motor holder disposed inside said main frame for receiving and supporting a motor used for driving said rotor blades to revolve and enabling said motor to be received in a shaft ring of said rotor device and positioned between the shaft ring and the motor holder; and*

*a plurality of guard blades radially arranged inside said main frame, fixed onto an inner surface of said main frame by each end thereof, and respectively having different crosssections;*

*wherein said guard blades have a shape substantially similar to that of rotor blades of said rotor device, and said guard blades and said rotor blades are arranged in a specific configuration for allowing a tangential velocity of an airflow to be transformed into a static pressure so as to supercharge said fan.*

*6. The fan guard according to claim 5 wherein said guard blades are arranged downstream of said rotor blades.*

*7. The fan guard according to claim 6 further comprising another set of guard blades accommodated in said main frame and arranged upstream of said rotor blades.*

*8. The fan guard according to claim 5 wherein said guard blades are arranged upstream of said rotor blades.*

*9. The fan guard according to claim 5 wherein a count of said guard blades is about 1~2 times of that of said rotor blades.*

*10. The fan guard according to claim 5 wherein said guard blades are made of plastic or metal.*

*11. The fan guard according to claim 5 further comprising at least one reinforcing ring connecting all of said guard blades for strengthening said fan guard.*

*12. A heat dissipation fan comprising:*

*a fan guard having a main frame, and a plurality of guard blades radially arranged inside said main frame, fixed onto an inner surface of said main frame by each end thereof, and respectively having a curved profile with a cross-sectional width that varies along a substantial portion of a chord of the guard blade;*

*a rotor device mounted inside said main frame and having a shaft ring and a plurality of rotor blades;*

*a motor holder for receiving and supporting a motor used for driving said rotor device to revolve and allowing said motor to be received in said shaft ring and positioned between the shaft ring and the motor holder;*

*wherein said guard blades have a shape substantially similar to that of said rotor blades, and are arranged relative to said rotor blades for allowing a tangential velocity of an airflow to be transformed into a static pressure so as to supercharge said fan.*

*13. The heat dissipation fan according to claim 12 wherein said motor holder is a hollow cylinder substantially located at the center of said main frame, and effecting a junction with the other ends of said guard blades.*

*14. The heat dissipation fan according to claim 12 further comprising at least one reinforcing ring connecting all of said guard blades for strengthening said fan guard.*

*15. The heat dissipation fan according to claim 12 wherein said guard blades are arranged upstream of said rotor blades of said rotor device.*

*16. The heat dissipation fan according to claim 12 wherein said guard blades are arranged downstream of said rotor blades of said rotor device.*

*17. A composite heat-dissipating fan comprising:*

*a fan guard having a main frame and a plurality of guard blades radially arranged inside said main frame, fixed onto an inner surface of said main frame by each end thereof, and respectively having a crosssection that varies along a substantial portion of a chord of the guard blade;*

*a first rotor device having a frame and a plurality of rotor blades, wherein said guard blades are optionally arranged upstream or downstream of said rotor blades of said first rotor device; and*

*a second rotor device arranged upstream of said fan guard and said first rotor device which is arranged downstream of said fan guard, wherein said main frame of said fan guard, said frame of said first rotor device and a frame of said second rotor device are assembled by screwing;*

*wherein said guard blades have a shape substantially similar to that of rotor blades of said first rotor device, and are arranged relative to said rotor blades of said first rotor device for allowing a tangential velocity of an airflow to be transformed into a static pressure so as to supercharge said fan.*

*18. The composite heat-dissipating fan according to claim 17 wherein said fan guard further comprises a motor holder which is a hollow cylinder substantially located at the center of said main frame, and effecting a junction with the other ends of said guard blades for receiving therein a motor used for driving said rotor blades to revolve.*

*19. The composite heat-dissipating fan according to claim 17 further comprising at least one reinforcing ring connecting all of said guard blades for strengthening said fan guard.*

*20. The composite heat-dissipating fan according to claim 17 wherein said main frame of said fan guard and said frame of said first rotor device are integrally formed together.*

*21. The composite heat-dissipating fan according to claim 17 wherein said guard blades are configured and arranged to simultaneously enhance efficiencies of said first rotor device and said second rotor device.*

*22. A fan guard for supporting a rotor device of a heat dissipation fan in order to supercharge said fan, comprising:*

*a main frame;*

*a plurality of guard blades radially arranged inside said main frame;*

*a holder located inside said main frame and integrally formed with said main frame and said guard blades as a monolithic piece for receiving and supporting a motor used for driving said rotor device to revolve;*

*wherein said guard blades have a shape that is substantially similar to that of rotor blades of said rotor device and that has a radially curved profile, and said guard blades and said rotor blades are arranged in a specific configuration for allowing a tangential velocity of an airflow to be transformed into a static pressure so as to supercharge said fan.*

*23. A heat dissipation fan comprising:*

*a rotor device having a motor and a plurality of rotor blades;*

*a fan guard having a frame surrounding said rotor device and a motor holder receiving and supporting said motor;*

*a set of guard blades radially disposed between said frame and said motor holder, respectively having a cross-section that varies along a substantial portion of a chord of the guard blade, and integrally formed with said motor holder and said frame of said fan guard together as a monolithic piece;*

*said guard blades and said rotor blades having a substantially similar shape relative to one another and being curved in different directions for allowing a tangential velocity of an airflow resulting from a revolution of said rotor blades to be transformed into a static pressure so as to supercharge said fan.*

*24. A composite heat-dissipating fan comprising:*

*a main frame;*

*a first rotor device disposed in said main frame and having a shaft ring, a motor and a plurality of rotor blades arranged around said shaft ring;*

*a fan guard having a frame, a motor holder for receiving and supporting said motor and enabling said motor to be received in said shaft ring of said first rotor device and positioned between the shaft ring and the motor holder, and a plurality of guard blades radially disposed between said frame and said motor holder and respectively having a curved profile with a cross-section that varies along a substantial portion of a chord of the guard blade;*

*wherein said guard blades and said rotor blades have a substantially similar shape relative to one another and are relatively arranged for allowing a tangential velocity of an airflow resulting from a revolution of said rotor blades to be transformed into a static pressure so as to supercharge said fan.*

*25. The composite heat-dissipating fan of claim 24 wherein said guard blades are arranged on an inlet side of said first rotor device.*

*26. The composite heat-dissipating fan of claim 24 wherein said guard blades are arranged on an outlet side of said first rotor device.*

*27. The composite heat-dissipating fan of claim 24 wherein said motor holder is a cup-shaped cylinder substantially located at the center of said frame of said fan guard, and integrally formed with said guard blades and said frame of said fan guard together.*

*28. The composite heat-dissipating fan according to claim 24 further comprising at least one reinforcing ring connecting all of said guard blades for strengthening said fan guard.*

*29. The composite heat-dissipating fan according to claim 24 further comprising a second rotor device having a frame and a plurality of rotor blades.*

*30. The composite heat-dissipating fan according to claim 29 wherein said first rotor device, said second rotor device, and said fan guard are assembled in series.*

*31. The composite heat-dissipating fan according to claim 29 wherein said first rotor device and said second rotor device are disposed on two opposite sides of said fan guard.*

*32. The composite heat-dissipating fan according to claim 31 wherein said main frame of said first rotor device, said frame of said second rotor device, and said frame of said fan guard are integrally formed together.*

*33. A composite heat-dissipating fan comprising:*

*a first fan unit having a frame, a plurality of rotor blades, and a fan guard with a plurality of guard blades respectively having a cross-section that varies along a substantial portion of a chord of the blade and curved in a direction different from that of said rotor blades of said first fan unit for transforming an intake airflow into a static pressure to supercharge said first fan unit; and*

*a second fan unit having a frame, a plurality of rotor blades, and a fan guard with a plurality of guard blades*

*respectively having a cross-section that varies along a substantial portion of a chord of the blade and curved in a direction different from that of said rotor blades of said second fan unit for transforming an intake airflow into a static pressure to supercharge said second fan unit;*

*wherein said first fan unit and said second fan unit are assembled together.*

*34. The composite heat-dissipating fan according to claim 33 wherein said first fan unit and said second fan unit are connected in series.*

*35. The composite heat-dissipating fan according to claim 33 wherein said plurality of rotor blades and said plurality of guard blades of said first fan unit and said plurality of rotor blades and said plurality of guard blades of said second fan unit are alternately arranged in series.*

*36. The composite heat-dissipating fan according to claim 33 wherein said first fan unit and second fan unit are assembled by screwing.*

*37. The composite heat-dissipating fan according to claim 33 wherein said plurality of guard blades of said first fan unit and said plurality of guard blades of said second fan unit have inclined angles, respectively.*

*38. The composite heat-dissipating fan according to claim 33 wherein said first and second fan units further comprise at least one reinforcing ring connecting all of said guard blades for strengthening said fan guard thereof, respectively.*

*39. A heat dissipation fan comprising:*

*a rotor device having a motor and a plurality of rotor blades;*

*a fan guard having a frame surrounding said rotor device, a motor holder receiving and supporting said motor, and a plurality of guard blades radially disposed between said motor holder and said frame and respectively having a crosssection that varies along a substantial portion of a chord of the guard blade;*

*wherein said guard blades and said rotor blades have a substantially similar shape relative to one another and are close to each other enough to allow a tangential velocity of an airflow resulting from a revolution of said rotor blades to be transformed into a static pressure so as to supercharge said fan.*

*40. The heat dissipation fan of claim 39 wherein said frame, said motor holder, and said guard blades of said fan guard are integrally formed as a single piece.*

*41. The heat dissipation fan according to claim 39 wherein said plurality of guard blades have inclined angles, respectively.*

*42. The heat dissipation fan according to claim 39 further comprising at least one reinforcing ring connecting all of said guard blades for strengthening said fan guard thereof, respectively.*

* * * * *